(12) United States Patent
Thomas et al.

(10) Patent No.: US 7,435,646 B2
(45) Date of Patent: Oct. 14, 2008

(54) METHOD FOR FORMING FLOATING GATES WITHIN NVM PROCESS

(75) Inventors: Jeffrey W. Thomas, Pflugerville, TX (US); Olubunmi O. Adetutu, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 73 days.

(21) Appl. No.: 11/208,670

(22) Filed: Aug. 22, 2005

(65) Prior Publication Data

US 2007/0042546 A1   Feb. 22, 2007

(51) Int. Cl.
*H01L 21/336* (2006.01)
(52) U.S. Cl. .................. 438/257; 257/E21.68
(58) Field of Classification Search .......... 438/257, 438/211, 201; 257/E21.68, E21.179, E21.422
See application file for complete search history.

(56) References Cited

U.S. PATENT DOCUMENTS

| | | | |
|---|---|---|---|
| 6,140,182 A | 10/2000 | Chen | 438/259 |
| 6,255,167 B1 | 7/2001 | Wu | 438/259 |
| 6,518,618 B1 | 2/2003 | Fazio et al. | 257/315 |
| 6,579,761 B1 | 6/2003 | Hsieh | 438/257 |
| 6,664,191 B1 | 12/2003 | Kim et al. | 438/700 |
| 2003/0203594 A1 | 10/2003 | Shimizu et al. | 438/424 |
| 2004/0152266 A1* | 8/2004 | Chuang et al. | 438/257 |
| 2005/0170579 A1* | 8/2005 | Hsu et al. | 438/211 |

\* cited by examiner

*Primary Examiner*—Thao P. Le
(74) *Attorney, Agent, or Firm*—Hamilton & Terrile, LLP; Michael Rocco Cannatti

(57) ABSTRACT

A semiconductor process and apparatus includes forming a semiconductor device by depositing a layer of nitride (20) over a semiconductor structure (10), patterning and etching the nitride layer to form a patterned nitride layer (42, 44), depositing a layer of polysilicon (62), planarizing the polysilicon layer with a CMP process to remove any portion of the polysilicon layer (62) above the patterned dielectric layer (42, 44), and then removing the patterned nitride layer (42, 44), thereby defining one or more polysilicon features (72, 74, 76) that can be used as floating gates, transistors gates, bit lines or any other semiconductor device feature.

9 Claims, 3 Drawing Sheets

METHOD FOR FORMING FLOATING GATES WITHIN NVM PROCESS

BACKGROUND OF THE INVENTION

1. Field of the Invention

The present invention is directed in general to the field of semiconductor devices. In one aspect, the present invention relates to the fabrication of small semiconductor features, such as floating gate or other semiconductor memory device structures.

2. Description of the Related Art

As the size of semiconductor device is scaled down, the requirements for device design and fabrication continue to be tightened in order to fit more circuitry on smaller chips. To achieve higher device packing densities, smaller and smaller sizes are required for device features, such as gate electrodes, interconnect lines, spacing and diameter of contact holes, and the surface geometry, such as corners and edges of various features. In addition, the spacing between adjacent features of an integrated circuit is also reduced in order to obtain higher packing densities.

Prior approaches used high resolution photolithographic processes in order to achieve small feature by improving the control of the length or width and placement of device features, such as the floating gates used in non-volatile memory (NVM) cells. For example, with NVM devices, the printing and etching of spaces in a floating gate poly layer is becoming more and more difficult as the poly-to-poly space shrinks. Conventional approaches for defining and separating the floating gates have required high resolution photolithographic processes to pattern and etch a space in a previously deposited polysilicon layer. With this process, the unetched polysilicon layer located over the active region serves as the floating gate(s) for the NVM bitcell. However, the selective etching of the polysilicon layer can result in overetching effects, such as mouse bites in the upper surface of a floating gate where the reduced width of the floating gate does not allow enough photoresist to protect the floating gate. Another overetching effect from conventional approaches is that the etched floating gates are too small, which can degrade device performance from the reduced charge storage capacity of the overetched floating gate.

Accordingly, a need exists for a smaller device features that are fabricated with a controlled process. There is also a need for a controlled fabrication process that reliably produces reduced spacing between device features. In addition, there is a need for improved semiconductor device structure and manufacturing process to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
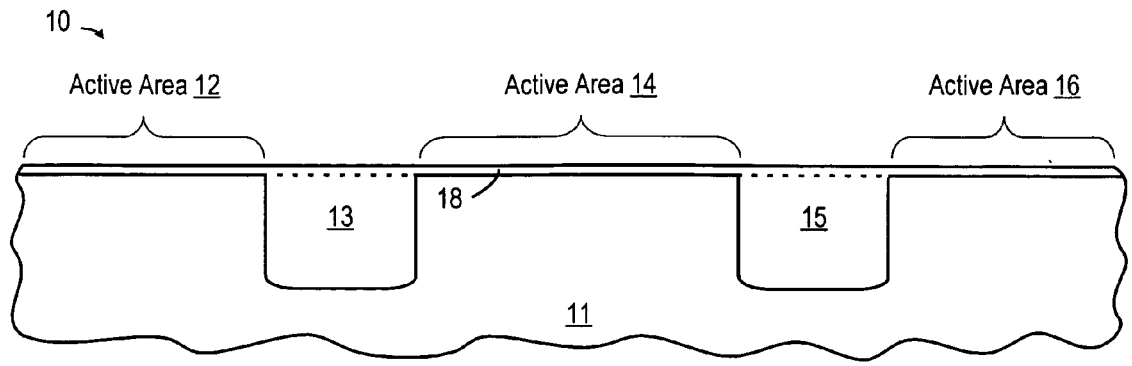
FIG. 1 is a partial cross-sectional view of an semiconductor structure including a substrate having one or more active regions defined by one or more isolation regions.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for selectively forming a device feature (such as a floating polysilicon gate) by depositing, patterning and etching a dielectric layer (such as nitride or oxynitride). Upon removal from the dielectric layer from the feature areas, the remaining portion(s) of the dielectric layer may be used to define one or more feature areas by depositing a layer of polysilicon material and then polishing or etching the polysilicon back to the remaining dielectric layer portions. By using selective formation of polysilicon instead of patterning and etching the polysilicon, smaller device features with reduced feature spacing may be obtained. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid unnecessarily limiting or obscuring the present invention. Such descriptions and representations are used by those skilled in the art to describe and convey the substance of their work to others skilled in the art. Various illustrative embodiments of the present invention will now be described in detail with reference to FIGS. 1-9. It is noted that, throughout this detailed description, certain layers of materials will be deposited and removed to form the depicted semiconductor structures. Where the specific procedures for depositing or removing such layers are not detailed below, conventional techniques to one skilled in the art for depositing, removing or otherwise forming such layers at appropriate thicknesses shall be intended. Such details are well known and not considered necessary to teach one skilled in the art of how to make or use the present invention.

In accordance with various illustrative embodiments of the present invention, there is disclosed a method and apparatus for fabricating a semiconductor device, such as a MOSFET transistor or NVM memory cell, by depositing and polishing a polysilicon layer over pre-defined dielectric structures, such as a printed and etched nitride layer. By patterning a dielectric layer to define the space(s) where the final polysilicon layer is to be subsequently formed, the polysilicon material may be deposited over the patterned dielectric layers and then etched back to effectively form a selectively-deposited polysilicon feature. The improved control resulting from such a process may advantageously be incorporated with CMOS process technology to build devices (such as floating polysilicon gates or MOSFET gate electrodes) having smaller feature sizes and/or more compact feature spacing.

In an illustrative embodiment depicted beginning with FIG. 1, a partial cross-sectional view of a semiconductor structure 10 is illustrated which includes a substrate 11. Depending on the type of transistor device being fabricated, the substrate 11 may be implemented as a bulk silicon substrate, single crystalline silicon (doped or undoped), or any semiconductor material including, for example, Si, SiC, SiGe, SiGeC, Ge, GaAs, InAs, InP as well as other Group III-IV compound semiconductors or any combination thereof, and may optionally be formed as the bulk handling wafer. In addition, the substrate 11 may be implemented as the top semiconductor layer of a semiconductor-on-insulator (SOI) structure.

The semiconductor structure 10 also includes one or more active regions 12, 14, 16 defined by one or more isolation regions 13, 15 (e.g., field oxide or isolation dielectric trenches) fabricated within the substrate 11. As the name implies, isolation regions 13, 15 serve to provide electrical and physical isolation between adjacent devices (e.g., NVM cells or transistors). Isolation regions 13, 15 are preferably comprised of a silicon-oxide (or other dielectric) compound formed by etching trenches into the substrate 11, filling the trenches with a deposited dielectric, and polishing or etching the wafer to remove the excess dielectric. Alternatively, isolation dielectric trenches may be formed using conventional LOCOS processing in which silicon nitride is deposited and patterned to define the isolation regions and, thereafter, the exposed substrate 11 is thermally oxidized to form the isolation dielectric. The semiconductor structure 10 may also include well regions (not shown) that are used to form PMOS and NMOS devices.

In the illustrated embodiment of FIG. 1, a first insulator layer 18 is formed over the substrate, which may be used to form a sacrificial oxide layer, a gate dielectric layer or a tunneling gate dielectric layer, depending on the type of device finally fabricated. In various embodiments, the first insulator layer 18 may be formed as a sacrificial oxide layer with silicon dioxide, though high-k or medium-k dielectric materials or metal oxide (MeOx) gate dielectric materials—such as hafnium dioxide or any other materials that may substitute for gate dielectric applications, including, for example, oxides, silicates or aluminates of zirconium, aluminum, lanthanum, strontium, titanium and combinations thereof—may also be used. In forming the semiconductor structure 10, the first insulator layer 18 is formed by depositing or growing a dielectric (e.g., silicon dioxide, oxynitride, metal-oxide, nitride, etc.) over the semiconductor substrate 11 using chemical vapor deposition (CVD), plasma-enhanced chemical vapor deposition (PECVD), physical vapor deposition (PVD), atomic layer deposition (ALD), thermal oxidation, or combinations of the above.

Figure 2:
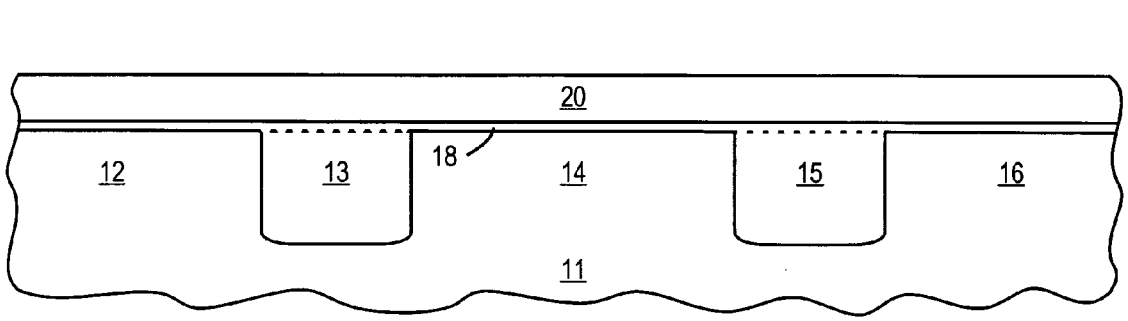
FIG. 2 illustrates processing subsequent to FIG. 1 after a first dielectric layer is formed on a first insulator layer.

After forming the first insulator layer 18, one or more electrodes or floating gates are formed above and/or within the defined active region(s) 12, 14, 16 by selectively depositing a feature material (e.g., polysilicon) using one or more of the techniques of the present invention. In accordance with an illustrative example whereby a floating gate and/or transistor gate electrode is selectively deposited, FIG. 2 illustrates processing subsequent to FIG. 1 after a first dielectric layer 20 is formed on the first insulator layer 18 of the semiconductor structure 10. In one embodiment, the first dielectric layer 20 includes silicon nitride, but may include other materials, such as PSG, FSG, silicon dioxide, and/or other types of dielectric including low-k dielectric materials.

Figure 3:
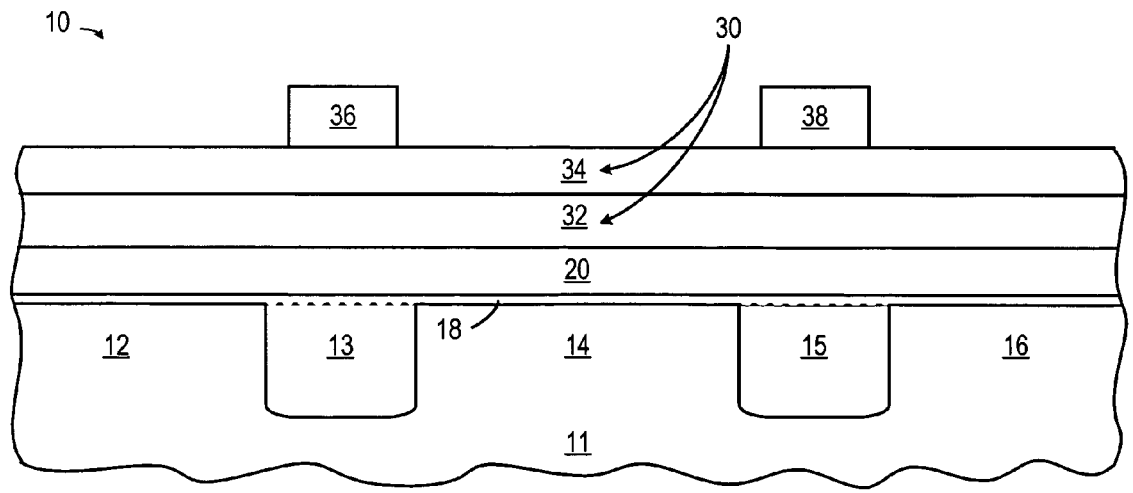
FIG. 3 illustrates processing subsequent to FIG. 2 after one or more masking layers are formed on the first dielectric layer.

The first dielectric layer 20 may be patterned and etched to form a patterned dielectric layer over the semiconductor structure 10, thereby defining feature areas over the active areas 12, 14, 16. Any desired pattern and etching processes may be used to form the patterned dielectric layer, including application and patterning of photoresist directly on the first dielectric layer 20. However, multi-layer masking techniques may also be used, such as illustrated in FIG. 3 which shows processing subsequent to FIG. 2 where one or more masking layers 30 are formed on the first dielectric layer for use in a narrow gate patterning process to print small lines of dielectric on the first dielectric layer 20. As depicted, the masking layers 30 are formed by sequentially depositing or forming a first masking layer 32 (such as an organic anti-reflective coating (OARC) layer), a second masking layer 34 (such as TEOS) and a photoresist layer (not shown) over the first dielectric layer 20.

The first masking layer 32 is formed over the first dielectric layer 20 with a material that will act as a hard mask when the first dielectric layer 20 is subsequently etched. Likewise, the second masking layer 34 is formed from a material (such as a dielectric material) that will serve as a hard mask for the etching of the first masking layer 32. As for the photoresist layer, it may be formed from any appropriate photoresist material (e.g., 193 nm resist) that is patterned (e.g., using a 193 nm develop) and etched to form a resist pattern 36, 38 over the second masking layer 34. The resist pattern 36, 38 is used to etch the exposed portions of the second masking layer 34 (e.g., by using a selective etchant process, such as an Argon, HBr, $CF_4$, $CL_2$ chemistry). The remaining or unetched portion(s) of the second masking layer 34 are then used as a hard mask to pattern the first masking layer 32 so that the exposed portions of the first masking layer 32 are removed (e.g., by using a selective etchant process, such as an Argon, $O_2$, HBr chemistry). Finally, the remaining or unetched portion(s) of the first masking layer 32 are used as a hard mask to pattern the first dielectric layer 20. The exposed portions of the first dielectric layer 20 are then removed, such as by etching or removing the exposed portions of the first dielectric layer 20 with a standard nitride wet or dry etch chemistry. The remaining, unetched portions(s) of the first dielectric layer 20 form a patterned dielectric layer.

Figure 4:
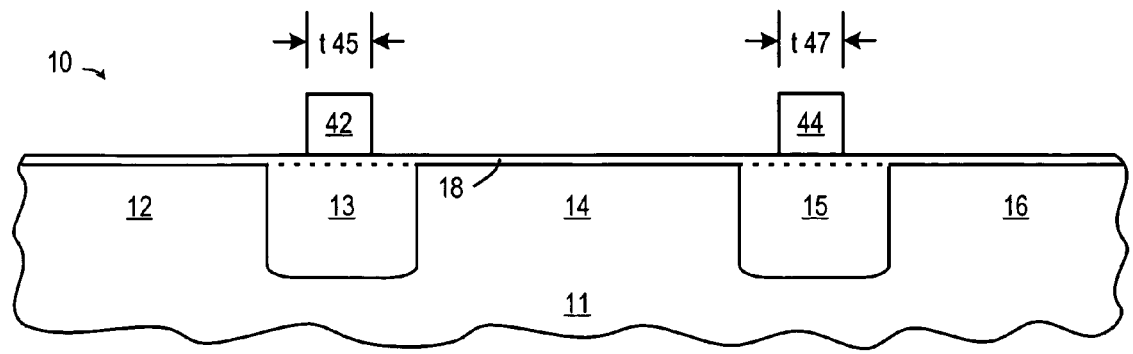
FIG. 4 illustrates processing subsequent to FIG. 3 after the masking layers are etched to leave an etched or patterned dielectric layer.

FIG. 4 illustrates processing subsequent to FIG. 3 after the previously unetched masking layers 30 are etched to leave a patterned dielectric layer 42, 44. By using the photoresist 36, 38 and the masking layer(s) 30 to etch the patterned dielectric layers 42, 44, very small feature widths 45, 47 for the patterned dielectric layers 42, 44 may be obtained, such as on the order of approximately 40 nm. Depending on the level of anisotropy in the etch process(es), the feature widths 45, 47 for the patterned dielectric layer 42, 44 may be smaller than the feature widths of the remnant photoresist 36, 38, insofar as the greater the isotropy of the etch process, the smaller the feature widths 45, 47 in relation to the photoresist widths 36, 38. While additional or fewer process steps may be used to form the patterned dielectric layer 42, 44, the example process described herein forms a patterned dielectric layer that may be used to prevent formation of polysilicon on the semiconductor structure 10 where the patterned dielectric layer 42, 44 are located.

In particular, after the patterned dielectric layer 42, 44 is formed, an optional dielectric formation step may be used to replace or supplement the first insulator layer 18 with a second insulator. In the illustrated embodiment of FIG. 5, a second insulator layer 52, 54, 56 is formed over the substrate 11 by optionally removing the first insulator layer 18 (which was provided as a sacrificial oxide layer), and then growing a gate dielectric layer or a tunneling gate dielectric layer 52, 54, 56, depending on the type of device finally fabricated. In various embodiments, the second insulator layer 52, 54, 56 may be formed with a dielectric material, such as silicon dioxide or silicon oxynitride, but may also be formed with one or more high-k or medium-k dielectric materials, such as a metal oxide (MeOx) gate dielectric layer. A suitable metal oxide compound for use as the second insulator layer 52, 54, 56 is hafnium oxide (preferably $HfO_2$), though other oxides, silicates or aluminates of zirconium, aluminum, lanthanum, strontium, titanium and combinations thereof may also be used, including but not limited to $Ta_2O_5$, $ZrO_2$, $HfO_2$, $TiO_2$, $Al_2O_3$, $Y_2O_3$, $La_2O_3$, $HfSiO_x$, $ZrSiO_x$, $LaSiO_x$, $YSiO_x$, $ScSiO_x$, $CeSiO_x$; $HfLaSiO_x$; $HfAlO_x$, $ZrAlO_x$, and $LaAlO_x$. In addition, multi-metallic oxides (for example barium strontium titanate, BST) may also provide high-k dielectric properties. In forming the semiconductor structure 10, the second insulator layer 52, 54, 56 may be formed by depositing or growing a dielectric (e.g., silicon dioxide, oxynitride, metal-oxide, nitride, etc.) over the semiconductor substrate 11 using chemical vapor deposition (CVD), plasma-enhanced chemical vapor deposition (PECVD), physical vapor deposition (PVD), atomic layer deposition (ALD), thermal oxidation, or combinations of the above. As will be appreciated, if the second insulator layer is formed with a deposition process, then the second insulator layer will also be formed on the exposed top and side surfaces of the patterned dielectric layer 42, 44, which must be taken into account in the subsequent processing steps. However formed, the second insulator layer 52, 54, 56 may be formed to a thickness of approximately 5 to 200 angstroms.

Figure 5:
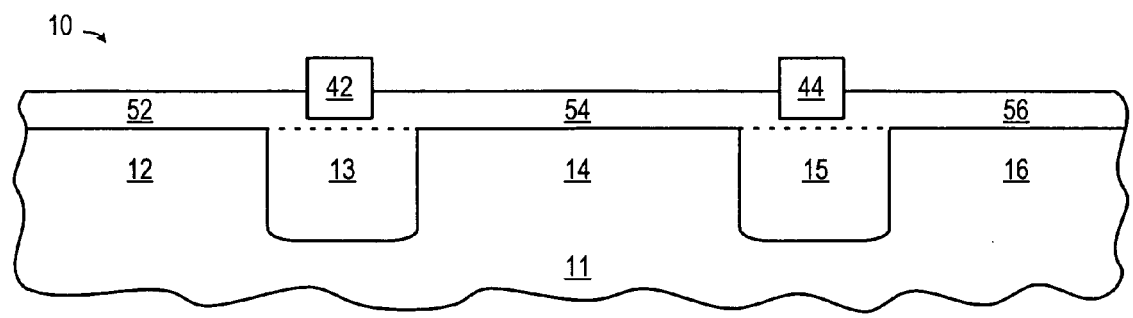
FIG. 5 illustrates processing subsequent to FIG. 4 after a second insulator layer is formed over the semiconductor structure
Figure 6:
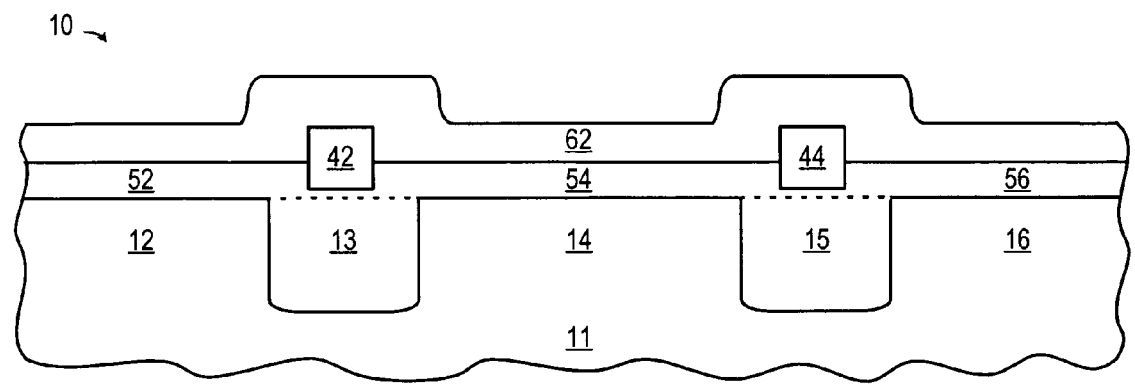
FIG. 6 illustrates processing subsequent to FIG. 5 after deposition of a layer of polysilicon material over the semiconductor structure.

FIG. 6 illustrates processing subsequent to FIG. 5 after deposition of a layer of conductive material 62 over the semiconductor structure 10. The conductive material may be formed from doped or undoped polysilicon that is blanket deposited over the second insulator layer 52, 54, 56 by CVD, PECVD, PVD, ALD, or combinations thereof to a thickness of approximately 500-2000 Angstroms, though a thinner or thicker layer may also be used. In addition, other conductive materials may be used to form the conductive layer 62, such as metal or any metal-containing material. By conformally depositing the polysilicon layer 62 over the patterned dielectric layer 42, 44 and the second insulator layer 52, 54, 56, a substantially uniform thickness of polysilicon is obtained that completely covers the top and sides of the patterned dielectric layer 42, 44 and the second insulator layer 52, 54, 56. As will be appreciated, with other types of non-volatile memory devices such as nanocluster devices and SONOS (silicon-oxide-nitride-oxide-silicon) devices, the polysilicon layer 62 may be replaced with different types of materials or structures, such as a plurality of nanoclusters or nanocrystals (i.e. discrete storage elements), such as in the case of a nanocrystal NVM device, or some other material for conducting and storing charge. Alternatively, the polysilicon layer 62 may be replaced with a nitride layer (not shown) which is subsequently used to provide a charge storage function in accordance with various non-volatile memory embodiments, in which case the patterned dielectric layer 42 will need to be formed from an isolating dielectric material that electrically isolates the charge storing nitride layer and that can be selectively etched with respect to the charge storing nitride layer (as described further below with reference to FIG. 8).

Figure 7:
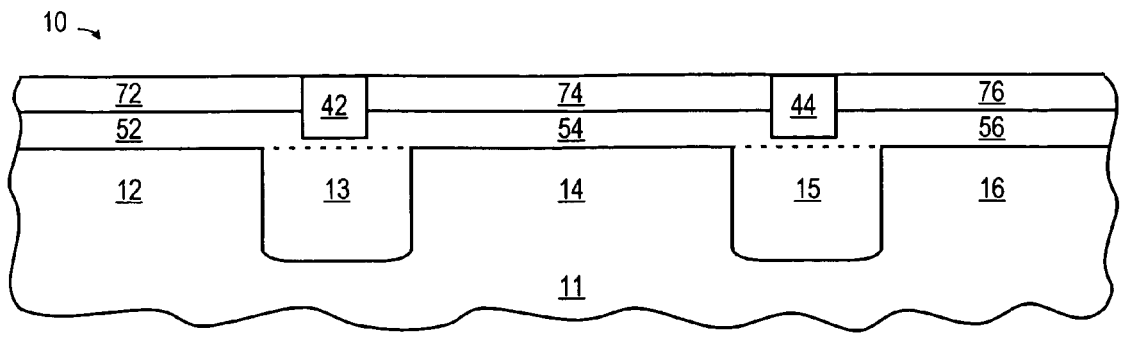
FIG. 7 illustrates processing subsequent to FIG. 6 after the polysilicon material is polished back until the first dielectric layer is exposed.

FIG. 7 illustrates processing subsequent to FIG. 6 after the layer of polysilicon material 62 is polished back or isotropically etched back with a wet or dry etch chemistry at least until the patterned dielectric layer 42, 44 is exposed, though additional polishing may also be used. In a selected embodiment, a chemical mechanical polish (CMP) process is used to planarize the polysilicon layer 62 until it is etched back and substantially co-planar with the tops of the patterned dielectric layer 42, 44, though other selective etch processes may also be used to planarized the polysilicon layer. By using a timed CMP process, the desired amount of material may be removed so that at least the top of the patterned dielectric layer 42, 44 is reached, although additional etching may also be used. As a result of the polishing step, the patterned dielectric layer 42, 44 defines one or more polysilicon features which may be used to form a floating gate or transistor gate electrode on the semiconductor structure 10.

As will be appreciated, the feature length or width of (as well as the spacing between) the etched polysilicon features 72, 74, 76 may be defined and placed in any desired location on the semiconductor structure 10 by controlling the printing and placement of the patterned dielectric layer 42, 44. As a result, the polysilicon features 72, 74, 76 may completely cover the active areas 12, 14, 16 (as shown in FIG. 7) or may be located to partially cover the active areas 12, 14, 16, depending on the width and/or placement of the patterned dielectric layer 42, 44.

Possible applications for the etched polysilicon feature(s) 72, 74, 76 include use as floating gates and/or transistor gate electrodes. In this application, it will be appreciated that additional processing steps will be used to complete the fabrication of the floating gate and low voltage transistor devices. Examples of such additional processing steps include sacrificial oxide formation, stripping, isolation region formation, extension implant, halo implant, control dielectric and control gate formation, spacer formation, source/drain implant, and polishing steps, along with conventional backend processing (not depicted) typically including formation of multiple levels of interconnect that are used to connect the transistors in a desired manner to achieve the desired functionality. Thus, the specific sequence of steps used to complete the fabrication of the floating gate and low voltage transistor devices may vary, depending on the process and/or design requirements. Also, other semiconductor device levels may be formed underneath or above semiconductor device 10.

Figure 8:
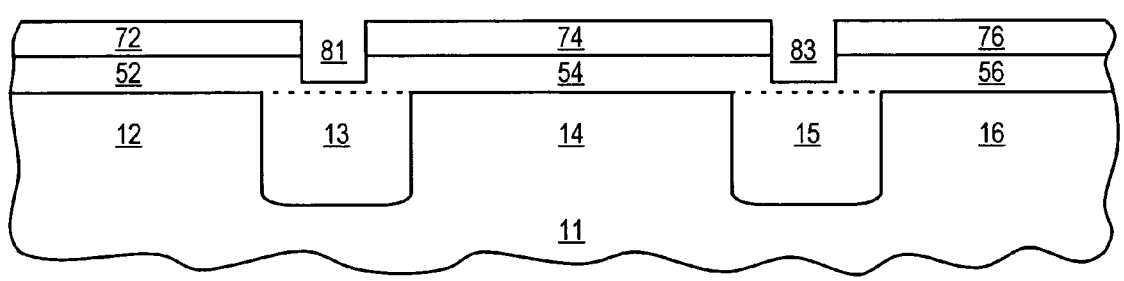
FIG. 8 illustrates processing subsequent to FIG. 7 after a patterned dielectric layer is removed.

In addition to reducing the size and placement spacing of or between floating gates, the polysilicon feature(s) 72, 74, 76 may also be used to increase the coupling ratio between the floating gate and the control gate. This is illustrated beginning with FIG. 8, which shows processing subsequent to FIG. 7 after a patterned dielectric layer 42, 44 is removed from the semiconductor structure 10. In particular, the patterned dielectric layer 42, 44 are removed using a wet or dry etch process, thereby leaving openings 81, 83 as illustrated in FIG. 8.

Figure 9:
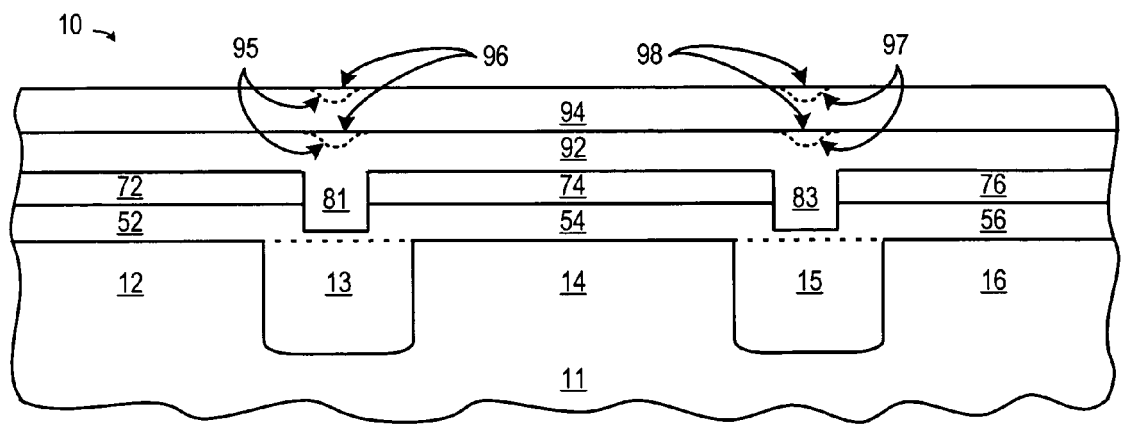
FIG. 9 illustrates processing subsequent to FIG. 8 after a control dielectric layer and control gate layer are formed on the semiconductor structure.

Next and as illustrated in FIG. 9, the control dielectric layer 92 may be formed by growing or depositing any dielectric, such as, for example, an insulating material or stack of insulating materials, such as, for example, silicon oxide, oxynitride, silicon nitride, silicon oxynitride, metal-oxide, metal nitride, metal silicate, metal aluminate, metal oxynitride, nitride, etc., by CVD, PECVD, PVD, ALD, or any combination thereof. In a selected embodiment, the control dielectric layer 92 is formed as a multi-layer ONO stack that is conformally deposited over the etched polysilicon feature(s) 72, 74, 76 and the openings 81, 83, where the ONO stack is formed from silicon oxide, silicon nitride (or a high-k dielectric, such as metal oxide) and silicon oxide. After formation of the control dielectric layer 92, a control gate layer 94 is then deposited or conformally formed over the control dielectric layer 92 by CVD, PECVD, PVD, ALD, or combinations thereof. Control gate layer 94 may be formed of any conductive material, such as polysilicon or a metal-containing material. As will be appreciated, the control dielectric layer 92 and control gate layer 94 may be conformally deposited over the etched polysilicon feature(s) 72, 74, 76 and the openings 81, 83 (as indicated by the dashed lines 95, 97) or may be formed as planarized layers (as indicated by the solid lines at layers 96 and 98) by completely filling or covering the openings 81, 83, such as by depositing and polishing one or more of the control dielectric layer 92 and/or control gate layer 94.

By forming the control gate as a continuous layer 94 across the floating gate gap at openings 81, 83, an increased coupling ratio between the control gate and the floating gate is obtained that results from the reduced spacing or gap between floating gates. In particular, existing techniques form the floating gate by printing a space (on the order of approximately 150 nm) between floating gates in an oxide-nitride-oxide (ONO) stack having a given pitch (e.g., 570 nm), whereby an upper etched layer (e.g., the control gate) is used as a mask to etch the underlying layers (e.g., control dielectric and floating gate layers). This approach results in lateral etching of each underlying layer, and can result in a coupling ratio of approximately 60% between the control gate and the floating gate. Keeping the pitch and ONO the same, a coupling ratio of approximately 73% can be achieved if the floating gate space was reduced to 40 nm using the techniques disclosed herein. An improved coupling ratio will allow lower voltages to be placed on the control gate. In addition, the improved coupling ratio may also permit scaling of the high voltage transistors that are used to route voltages to the NVM array. Additionally, the size of the NVM unit cell may shrink by 90 nm (from 150 nm to 40 nm) in one direction.

In one form, there is provided herein method for forming a feature in a semiconductor device, such as a non-volatile memory semiconductor device, a MOSFET transistor device or a bit line. As a preliminary step, a layer of nitride or some other dielectric material is formed over semiconductor structure, such as a semiconductor substrate on which is formed a sacrificial oxide layer. Next, predetermined parts of the nitride layer are removed, such as by patterning and etching the nitride layer (or one or more masking layers over the nitride layer) to leave a patterned nitride layer over the semiconductor structure. A floating gate layer is then formed over the semiconductor structure so that the patterned nitride layer is substantially completely covered or filled to improve uniformity. The floating gate layer may be formed over a tunneling dielectric layer with a polysilicon material, a nanocrystal material, a nitride material or an ONO stack. By subjecting the semiconductor structure to a chemical mechanical polishing step, the portions of the floating gate layer above the patterned nitride layer are removed and planarized into substantial alignment with the upper surface of the patterned nitride layer to define one or more floating gates. When the floating gates are formed over a tunneling dielectric layer, they may be used to form a floating gate in an NVM device by forming a control gate over the floating gate that is isolated from the floating gate by a control dielectric layer.

In another form, a method is provided for manufacturing a semiconductor device by selectively forming one or more lines in a conductive layer that is formed over a substrate. In the method, a first dielectric layer (e.g., a deposited nitride layer) is formed over the substrate, and then parts of the first dielectric layer are removed by patterning and etching the first dielectric layer to leave a patterned dielectric layer over the substrate. Next, a conductive layer (e.g., doped or undoped polysilicon or metal) is deposited or formed over the patterned dielectric layer and the substrate to cover the patterned dielectric layer. By then polishing the conductive layer to remove any portion of the conductive layer above the patterned dielectric layer, one or more lines in the conductive layer are formed. For example, by planarizing the conductive layer with a chemical mechanical polish process, the conductive layer is substantially aligned with the upper surface of the patterned dielectric layer. With this process, the lines in the conductive layer may be used to form floating gates in a non-volatile memory device by removing the patterned dielectric layer after polishing the conductive layer, and then forming a control gate over the floating gate that is isolated from the floating gate by a control dielectric layer. Alternatively, the lines in the conductive layer may be used to form gates in a MOSFET transistor.

In yet another form, a method is provided for manufacturing floating gates in a non-volatile memory device. Under the method, a semiconductor substrate is provided and one or more isolation regions are formed in the substrate. Next, a nitride layer is formed over the substrate and then etched to leave nitride spacer segments over at least part of the isolation regions in the semiconductor substrate. At this point, a tunneling gate dielectric layer may be formed over the substrate between the nitride spacer segments, though at least part of the tunneling gate dielectric layer may be been previously formed. By covering the nitride spacer segments and tunneling gate dielectric layer with a deposited gate layer, planarizing the deposited gate layer down to the nitride spacer segments using a chemical mechanical polish and then removing the nitride spacer segments, at least part of one or more floating gates for the non-volatile memory device are thereby defined over the substrate.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the polysilicon features are described with reference to forming a floating gate device, though in alternate embodiments, the polysilicon features may be used to form polysilicon gates or features in any type of MOSFET transistor, double gate fully depleted semiconductor-on-insulator (FDSOI) transistor or other NVM transistor (such as a nanocluster stack-based NVM device). The depicted transistor structures may also be formed in a well region (not shown) of the substrate 11 which may be an n-doped well or a p-doped well. Also, the floating gate, control gate, and polysilicon gate layers may be formed with different conductive materials than those disclosed, such as doped or undoped polysilicon or metal material. In addition, the source and drain regions may include extension regions and may be p-type or n-type, depending on the polarity of the underlying substrate or well region, in order to form either p-type or n-type semiconductor devices. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a non-volatile memory semiconductor device, comprising:
   providing a semiconductor structure;
   forming a first dielectric layer over the semiconductor structure;
   removing part of the first dielectric layer to leave a patterned dielectric layer over the semiconductor structure;
   forming a floating gate layer over the semiconductor structure so that the patterned dielectric layer is substantially completely filled; and
   planarizing the semiconductor structure to remove any portion of the floating gate layer above the patterned dielectric layer to define one or more floating gates within the patterned dielectric layer.

2. The method of claim 1, wherein the semiconductor structure comprises a sacrificial oxide layer formed on a semiconductor substrate.

3. The method of claim 1, wherein the first dielectric layer comprises a layer of nitride deposited over the semiconductor structure.

4. The method of claim 1, wherein removing part of the first dielectric layer comprises patterning and etching the first dielectric layer to leave a patterned dielectric layer over the semiconductor structure.

5. The method of claim 1, wherein removing part of the first dielectric layer comprises patterning and etching one or more masking layers formed on the first dielectric layer to leave a patterned dielectric layer over the semiconductor structure.

6. The method of claim 1, wherein planarizing the semiconductor structure comprises planarizing the floating gate layer into substantial alignment with an upper surface of the patterned dielectric layer.

7. The method of claim 1, wherein planarizing the semiconductor structure comprises a chemical mechanical polish process.

8. The method of claim 1, wherein the one or more floating gates are formed over a tunneling dielectric layer with a polysilicon material, a nanocrystal material, a nitride material or an ONO stack.

9. The method of claim 1, further comprising removing the patterned dielectric layer after planarizing the semiconductor structure before forming a control gate over the floating gate that is isolated from the floating gate by a control dielectric layer.

* * * * *